United States Patent
Chujo

(10) Patent No.: US 6,731,045 B2
(45) Date of Patent: May 4, 2004

(54) METHOD OF MANUFACTURING SURFACE ACOUSTIC WAVE DEVICE AND SURFACE ACOUSTIC WAVE DEVICE

(75) Inventor: Rieko Chujo, Chiyoda-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/042,196

(22) Filed: Jan. 11, 2002

(65) Prior Publication Data

US 2002/0057037 A1 May 16, 2002

Related U.S. Application Data

(63) Continuation of application No. PCT/JP01/03864, filed on May 9, 2001.

(30) Foreign Application Priority Data

May 11, 2000 (JP) ........................................ 2000-138098

(51) Int. Cl.$^7$ ............................................... H01L 41/08
(52) U.S. Cl. .................................................. 310/313 R
(58) Field of Search .......................... 310/313 R, 344, 310/348

(56) References Cited

U.S. PATENT DOCUMENTS

| | | | | |
|---|---|---|---|---|
| 4,733,122 A | * | 3/1988 | Shinonaga et al. | 310/313 R |
| 4,737,742 A | * | 4/1988 | Takoshima et al. | 333/150 |
| 4,993,000 A | * | 2/1991 | Niitsuma et al. | 367/140 |
| 6,351,194 B2 | * | 2/2002 | Takahashi et al. | 333/133 |

FOREIGN PATENT DOCUMENTS

| | | |
|---|---|---|
| JP | 8-330880 | 12/1996 |
| JP | 10-223694 | 8/1998 |
| JP | 11-40942 | 2/1999 |
| JP | 11-122072 | 4/1999 |

* cited by examiner

*Primary Examiner*—Mark Budd
(74) *Attorney, Agent, or Firm*—Oblon, Spivak, McClelland, Maier & Neustadt, P.C.

(57) ABSTRACT

An attempt is made to reduce the size of a multichip package obtained by mounting a plurality of surface acoustic wave elements having different frequency characteristics in one package. For this purpose, when a plurality of surface acoustic wave elements are face-down bonded to a package, the ultrasound wave application direction is set to a direction substantially perpendicular to the direction in which the surface acoustic wave elements are juxtaposed.

3 Claims, 3 Drawing Sheets

METHOD OF MANUFACTURING SURFACE ACOUSTIC WAVE DEVICE AND SURFACE ACOUSTIC WAVE DEVICE

CROSS-REFERENCE TO RELATED APPLICATIONS

This is a Continuation Application of PCT Application No. PCT/JP01/03864, filed May 9, 2001, which was not published under PCT Article 21(2) in English.

This application is based upon and claims the benefit of priority from the prior Japanese Patent Application No. 2000-138098, filed May 11, 2000, the entire contents of which are incorporated herein by reference.

BACKGROUND OF THE INVENTION

1. Field of the Invention

The present invention relates to a surface acoustic wave device having surface acoustic wave elements face-down mounted in a package and, more particularly, to a surface acoustic wave device having a plurality of surface acoustic wave elements mounted side by side in one package and a method of manufacturing the same.

2. Description of the Related Art

Prior Art

Recently, to cope with international roaming services (e.g., roaming services based on the US-CDMA scheme and JAPAN-CDMA scheme) in the field of mobile communication, a surface acoustic wave device in a single package which can cope with a plurality of communication schemes has been developed. As a means for implementing such a package, a method of mounting a plurality of surface acoustic wave elements having different frequency characteristics in correspondence with different communication schemes in a common package (to be briefly referred to as a multichip package hereinafter) is available.

As a method of mounting each surface acoustic wave device in a package, the face-down bonding scheme has been developed and put into practice, which can further reduce the device size as compared with the conventional wire bonding scheme.

In applying the face-down bonding scheme to a multichip package, first of all, the first element is face-down mounted on the base of a package, and the connection terminals of a surface acoustic wave comb electrode are joined to a metalized layer formed on the inner surface of the base (die attach surface) through metal bumps serving as joining or bonding members. The second element is then mounted in a space adjacent to this element, and joined or bonded to the metalized layer of the package through metal bumps in the same manner as described above. In this joining/bonding process, a load is imposed from a tool holding the element to the metal bumps, and at the same time, ultrasound waves are applied to the metal bumps through the tool. As a consequence, the metal bumps melt to join or bond the electrode connection terminals to the metalized layer.

For example, a conventional multichip surface acoustic wave device is disclosed in Jpn. Pat. Appln. KOKAI Publication No. 11-122072 (see FIG. 1 of this publication). The device in this reference uses the above "face-down bonding scheme".

Problem

In the joining/bonding process, since ultrasound vibrations are applied to the holding tool, a surface acoustic wave element is mounted with a positional shift. When the second element is inserted into the package, it (the second element) comes into contact with the first element or a side wall of the package, causing an inconvenience related to the degree of positional shift. For this reason, an adequate (large) margin must be provided in advance for the mount position of each element.

As the above (large) margin is provided, it becomes more difficult to attain a reduction in device size. Demands have therefore arisen for further improvements.

Object

The present invention has been made in consideration of the above situation and, has as its object to provide a multichip package surface acoustic wave device and a method of manufacturing the device, which can attain a reduction in device size as compared to the conventional device.

BRIEF SUMMARY OF THE INVENTION

In order to achieve the above object, in a method of manufacturing a surface acoustic wave device according to an aspect of the present invention, in the step of joining or bonding the electrode terminals of a surface acoustic wave element to the die attach surface of a package, the ultrasound wave application direction is set to a direction substantially perpendicular to the element layout direction.

The positional shift of a surface acoustic wave element increases along the ultrasound wave application direction. By setting this ultrasound wave application direction to a direction in which no other chip (no other surface acoustic wave element) is mounted, the margin of a mount position can be greatly reduced (to almost ½) as compared with the case where the ultrasound wave application direction is set to the chip mounting direction. This makes it possible to reduce the size of a surface acoustic wave device.

A surface acoustic wave device according to another aspect of the present invention is configured such that each metal bump has a smashed shape whose major axis coincides with a direction substantially perpendicular to the direction in which a plurality of surface acoustic wave elements are juxtaposed (shape 14 elongated in the vertical direction in FIG. 4).

By making the application direction of ultrasound waves or the like in the joining/bonding step substantially perpendicular to the element juxtaposition direction, each metal bump has a shape smashed along the ultrasound wave application direction in the joining/bonding step. If each connection terminal of a comb electrode is formed into an elongated shape in accordance with the smashed shape of this metal bump, the area occupied by the connection terminal can be reduced while an adequate bonding strength/bonding area is ensured. This makes it possible to attain a reduction in package size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A method of manufacturing a surface acoustic wave device and a surface acoustic wave device according to an embodiment of the present invention will be described below with reference to the views of the accompanying drawing.

Figure 1:
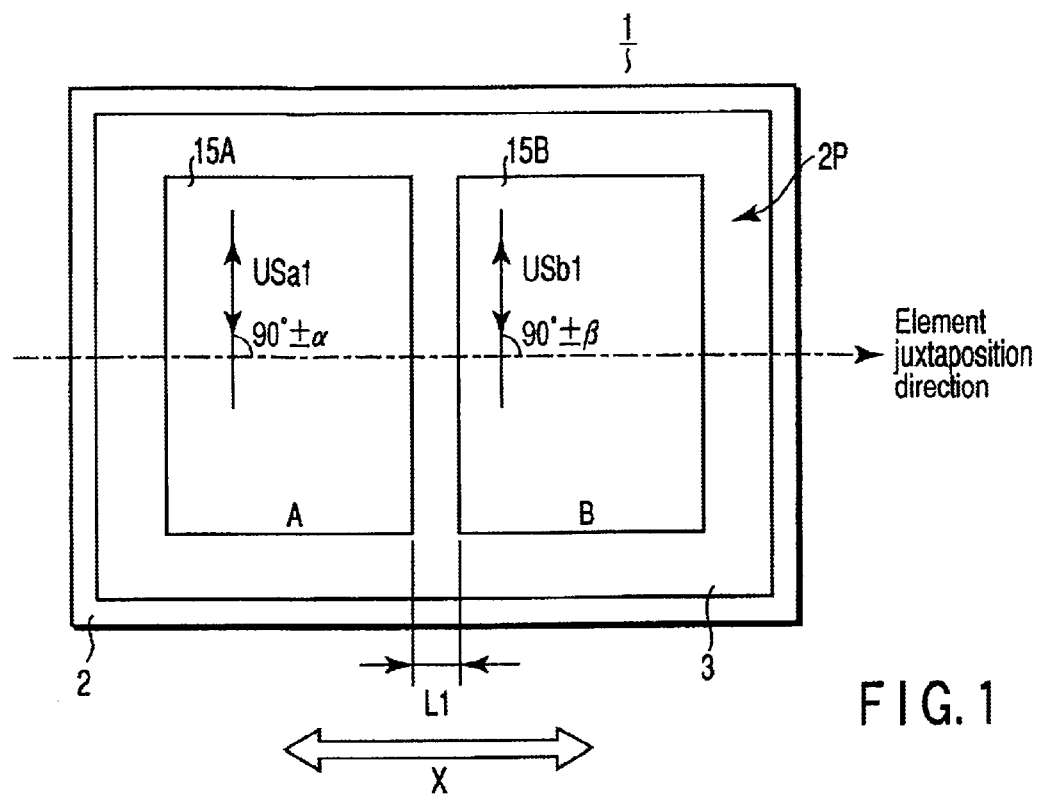
FIG. 1 is a view showing an example of the internal layout of a surface acoustic wave device according to an embodiment of the present invention.

As shown in FIG. 1, surface acoustic wave device 1 according to this embodiment is formed by using package 2P having base 3 made of, for example, a ceramic material and frame-like side walls 2 (although this package 2P has a sealing cap on the opposite side to base 3, an illustration of the cap will be omitted). In this package 2P, two types of surface acoustic wave elements A and B (each corresponding to "10" in FIG. 2) having different passing frequency specifications are housed side by side (the frequency characteristic of element A exhibits, for example, a bandpass characteristic for the US-CDMA scheme, and the frequency characteristic of element B exhibits, for example, a bandpass characteristic for the JAPAN-CDMA scheme).

Figure 2:
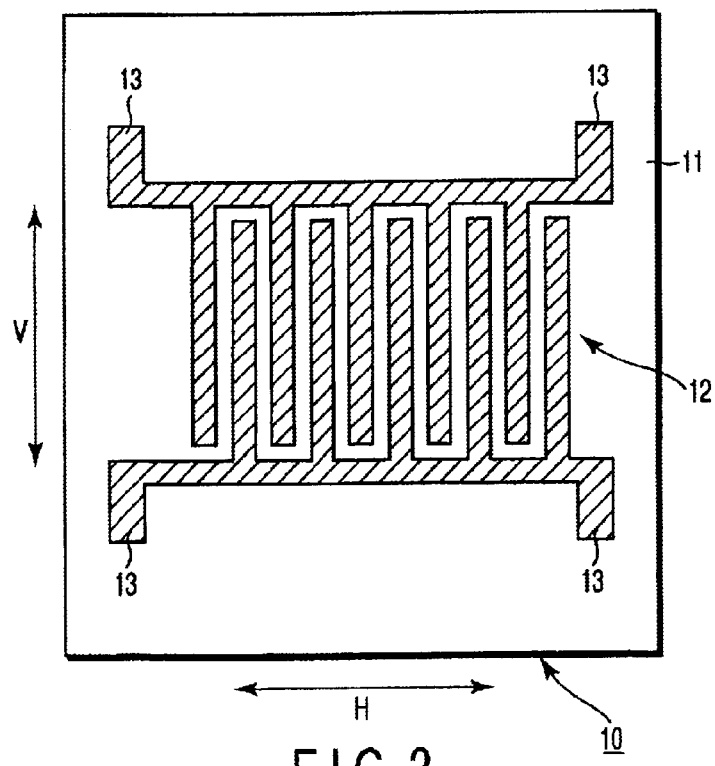
FIG. 2 is a plan view schematically showing the structure of a surface acoustic wave element (A or B) according to an embodiment of the present invention.

FIG. 2 is a plan view schematically showing the structure (single interdigital transducer IDT) of surface acoustic wave element 10 (element A or B in FIG. 1). Surface acoustic wave element 10 has comb electrode 12 made of an aluminum alloy which is formed on piezoelectric substrate 11 made of, for example, lithium tantalate. Connection terminals 13 are formed on the four corner portions of this electrode 12. While surface acoustic wave element 10 is mounted on base 3 in FIG. 1, horizontal direction H in FIG. 2 corresponds to lateral direction X in FIG. 1, and vertical direction V in FIG. 2 corresponds to an up-and-down direction USa1 or USb1 in FIG. 1.

Figure 3:
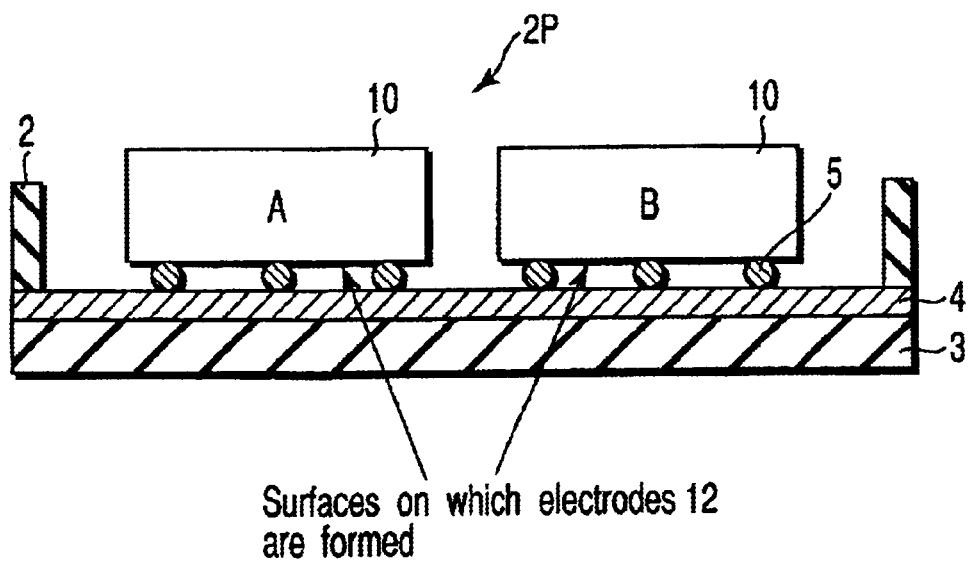
FIG. 3 is a view showing a sectional structure in which surface acoustic wave elements (A and B) are mounted in a package.

FIG. 3 shows a sectional structure in which the surface acoustic wave elements 10 (A, B) are mounted on base 3 in package 2P. Connection terminals 13 of surface acoustic wave element 10 are joined to metalized layer 4, which is formed on the die attach surface on base 3, at predetermined positions through joining members formed by metal bumps 5.

In this embodiment, alumina ceramic is used as a material for base 3. As metalized layer 4, a layer obtained by plating a tungsten layer with nickel and further plating the nickel plating with gold is used. Gold is used for metal bumps 5. If metal bump 5 and metalized layer 4 joined to the bump are made of the same material (gold in this case), their joining/bonding properties are improved.

Figure 4:
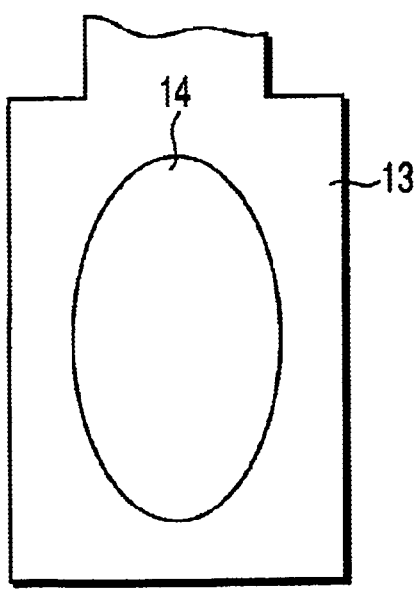
FIG. 4 is a view schematically showing a state where metal bump 5 adheres to connection terminal 13 of surface acoustic wave element 10.

FIG. 4 schematically shows a state where metal bump 5 is joined or bonded to connection terminal 13. FIG. 4 exemplifies the case where connection terminal 13 has a rectangular shape that is elongated in accordance with the elongated shape (extended shape) of metal bump 5. Note that the rectangular shape exemplified in FIG. 4 is merely an example, and the use of another shape is not inhibited.

The steps in manufacturing surface acoustic wave device 1 according to an embodiment of the present invention will be described next with reference to the flow chart of FIG. 5, with FIGS. 1 to 3 being referred to as needed.

First of all, an aluminum alloy layer is formed on piezoelectric substrate 11 and etched by using a predetermined mask pattern (step ST10). As a result, an electrode pattern (IDT pattern) having comb electrode 12 and connection terminal 13 integrally formed as shown in FIG. 2 is obtained. With this etching step ST10, the necessary number of surface acoustic wave elements 10 (two surface acoustic wave elements A and B per surface acoustic wave device in the case shown in FIG. 1) are manufactured.

Metal bumps 5 are then arranged (bonded) on metalized layer 4, formed on the die attach surface on base 3, at predetermined positions where the bumps are joined or bonded to connection terminals 13 of first surface acoustic wave element 10 (element A in this case) (i.e., the positions where the bumps face connection terminals 13 of element A face-down mounted on the die attach surface) (step ST12).

Note that the arrangement positions of metal bumps 5 are managed relatively accurately with respect to metalized layer 4, but are managed relatively roughly with respect to the respective connection terminals 13.

First surface acoustic wave element 10 (A) is then held/chucked by a chucking head (not shown), and element A is transferred to a predetermined element mount region 15A on base 3, together with the chucking head (step ST14).

Ultrasound waves are applied to the chucking head, which is holding/chucking element A, in the direction USa1 in FIG. 1 or direction V in FIG. 2. Excitation by this ultrasound wave application can be performed by a means such as an ultrasound wave horn (not shown). In this case, the direction in which ultrasound waves are applied (direction USa1) coincides with the main vibration direction of the chucking head (not shown) (the main vibration direction of element A or direction V in FIG. 2).

With the above ultrasound wave application, surface acoustic wave element 10 (A) is mounted on the die attach surface of base 3 in the following manner.

First of all, the chucking head (not shown) holding/chucking surface acoustic wave element 10 (A) is lowered toward element mount region 15A on the die attach surface of base 3 such that the main vibration direction (direction USa1 in FIG. 1) of ultrasound waves becomes almost perpendicular to the juxtaposition direction (the direction indicated by arrow X in FIG. 1) of surface acoustic wave elements 10 (A and B), and surface acoustic wave element 10 (A) is pressed against base 3 (step ST16).

Note that if the juxtaposition direction (the direction indicated by arrow X in FIG. 1) of a plurality of surface acoustic wave elements 10 (A and B) is parallel to the extending direction of the lower side (or upper side) of base 3, the main vibration direction of ultrasound waves may become almost perpendicular to the extending direction of the lower side (upper side) of base 3.

That "the main vibration direction (direction USa1) of ultrasound waves becomes almost perpendicular to the juxtaposition direction (the direction indicated by arrow X) of the surface acoustic wave elements" indicates that when the angle between direction USa1 and the direction indicated by arrow X is represented by $90°\pm\alpha$, $\alpha$ need not be 0.

The allowable range of α should be determined to absorb, with a sufficient margin, the maximum value of the "shift" from 90° which is caused by the following errors:

(1) an alignment error caused when the chip of surface acoustic wave element 10 is mounted on base 3; and
(2) a vibration direction error in a device itself which joins (bonds) the chip of surface acoustic wave element 10 to metalized layer 4 on base 3.

With the pressing operation in step ST16, a load is imposed on metal bump 5 clamped between connection terminal 13 of surface acoustic wave element 10 (A) and metalized layer 4 on base 3 at a predetermined position. In this state, ultrasound waves are simultaneously applied from the ultrasound wave horn (not shown) to metal bump 5 (step ST18). As a consequence, metal bump 5 melts (due to the frictional heat generated by high-speed vibrations), and each connection terminal 13 of surface acoustic wave element 10 (A) is joined or bonded (electrically connected and mechanically coupled) to a predetermined portion of metalized layer 4.

Note that the detailed arrangements of the above chucking head and ultrasound wave horn are disclosed in, for example, Jpn. Pat. Appln. KOKAI Publication No. 10-223694. Since the detailed arrangements of the chucking head and ultrasound wave horn are disclosed in such references, a detailed description of the contents will be omitted. However, the present application incorporates the contents disclosed in the above reference (FIG. 1 and a description thereof, in particular).

If there still remains an element to be joined (YES in step ST20) after first surface acoustic wave element 10 (A) is joined in the above manner, second surface acoustic wave element 10 (B) is joined in the same steps as steps ST12 to ST18.

More specifically, metal bumps 5 are arranged at predetermined positions on metalized layer 4 at which the bumps are joined or bonded to connection terminals 13 of second element B (step ST12). Element B is then held/chucked by the chucking head and transferred to predetermined element mount region 15B on base 3 (step ST14). Ultrasound waves are applied to the chucking head holding/chucking element B in direction USb1 in FIG. 1 or direction V in FIG. 2. In this case, the application direction of ultrasound waves (direction USb1) coincides with the main vibration direction of the chucking head.

Subsequently, the chucking head holding/chucking element B is lowered toward element mount region 15B on base 3 such that the main vibration direction (direction USb1) of ultrasound waves becomes almost perpendicular to the juxtaposition direction (the direction indicated by arrow X) of the surface acoustic wave elements, and element B is pressed against base 3 (step ST16).

That "the main vibration direction (direction USb1) of ultrasound waves becomes almost perpendicular to the juxtaposition direction (the direction indicated by arrow X) of the surface acoustic wave elements" indicates that when the angle between direction USb1 and the direction indicated by arrow X is represented by 90°±β, β need not be 0. The allowable range of β may be set in the same manner as a described above.

With the pressing operation in step ST16, a load is imposed on metal bump 5 clamped between connection terminal 13 of element B and metalized layer 4 on base 3 at a predetermined position. In this state, ultrasound waves are simultaneously applied from the ultrasound wave horn (not shown) to metal bump 5 (step ST18). As a consequence, metal bump 5 melts, and each connection terminal 13 of element B is joined or bonded to a predetermined portion of metalized layer 4.

If second surface acoustic wave element 10 (B) is joined or bonded in the above manner and there is no surface acoustic wave device to be joined or bonded (NO in step ST20), a cap (not shown) is fitted on elements A and B from above, and the cap is attached to package side walls 2 (step ST22). In this manner, one surface acoustic wave device 1 is completed.

Figure 5:
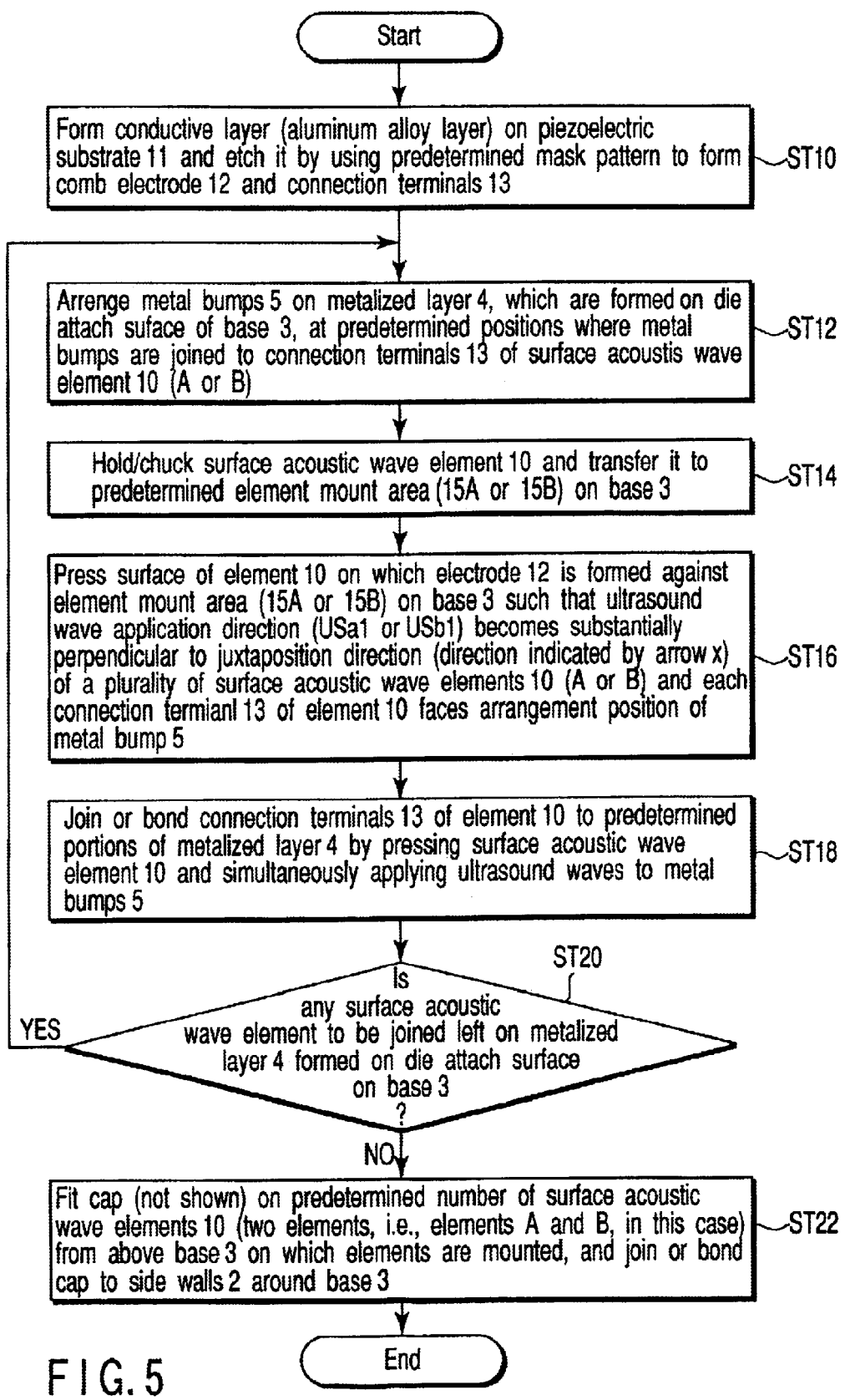
FIG. 5 is a flow chart for explaining a manufacturing process for the surface acoustic wave device according to an embodiment of the present invention.

A desired number of surface acoustic wave devices 1 can be manufactured by repeating the steps in FIG. 5.

Note that etching step ST10 may be executed at a time and place different from those in subsequent steps ST12 to ST22. That is, a predetermined number of surface acoustic wave elements 10 may be prepared before the execution of step ST12 and the subsequent steps. More specifically, the present invention can also be practiced by preparing (purchasing) a plurality of surface acoustic wave elements 10 as finished parts in advance and executing the steps after step ST12 in FIG. 5 by using these surface acoustic wave elements.

After the joining/bonding process (steps ST12 to ST18) in FIG. 5, metal bump 5 has an elongated shape 14 extending in the application direction of ultrasound waves, as shown in FIG. 4. The joining/bonding strength between surface acoustic wave element 10 and base 3 depends on the size of the joining/bonding area between connection terminal 13 and metal bump 5. If, therefore, the size of connection terminal 13 is minimized within the range in which the connection terminal covers the entire elongated shape (extended shape) 14 of metal bump 5, the area occupied by connection terminal 13 can be reduced while the connection strength is maintained. That is, if connection terminal 13 is formed into an elongated shape (a rectangle, a rectangle with four rounded corners, or the like) in accordance with elongated shape (extended shape) 14 of metal bump 5, the packing density of a plurality of surface acoustic wave elements 10 (A, B) can be increased while the necessary connection strength is maintained.

The following numerical values exemplify how the packing density can be increased.

Assume that connection terminal 13 shown in FIGS. 2 and 4 is shaped such that each long side (a direction perpendicular to the juxtaposition direction of elements A and B; direction USa1/USb1 in FIG. 1, and direction V in FIG. 2) is 150 μm long, and each short side (the juxtaposition direction of elements A and B; direction X in FIG. 1; and direction H in FIG. 2) is 120 μm long.

When surface acoustic wave device 1 is manufactured by the method shown in FIG. 5 using surface acoustic wave element 10 having connection terminals 13 described above, the positional shift of surface acoustic wave element 10 (A or B) reaches a maximum value of 31 μm in the element juxtaposition direction (direction X in FIG. 1), and a maximum value of 76 μm in the ultrasound wave application direction (direction USa1/USb1 in FIG. 1) perpendicular to the element juxtaposition direction. In this case, an inter-element distance L1 between the surface acoustic wave element A and surface acoustic wave element B may be set to L1=62 μm, which is twice a position shift of 31 μm, in consideration of a margin for the positional shift.

If surface acoustic wave elements are joined or bonded by applying ultrasound waves in the element juxtaposition direction without using the present invention, inter-element distance L1 between surface acoustic wave element A and surface acoustic wave element B must be set to L1=152 μm, which is twice a positional shift of 76 μm, in consideration of a margin for the positional shift.

According to this embodiment of the present invention, therefore, the inter-element margin L1 can be greatly reduced to ½ or less. This makes it possible to increase the packing density of a plurality of surface acoustic wave elements and attain a reduction in the size of a multichip package surface acoustic wave device.

Note that if the angle defined by the ultrasound wave application direction and the element juxtaposition direction shifts from 90° in the joining/bonding process, the above positional shift also increases, resulting in a deterioration in the effect obtained by practicing the present invention (an increase in packing density with a reduction in positional shift). If, however, the shift falls within the range of 90°±α or 90°±β, a sufficient benefit can be obtained by practicing the present invention.

The structure of surface acoustic wave element 10, components, and the like in the embodiment of the present invention are not limited to those described above and can be variously changed. For example, a filter element can be formed by cascading many IDT (comb electrodes 12) on multiple stages on one piezoelectric substrate 11. The number of IDTs on each stage can be arbitrarily set to one or more. In addition, the number of surface acoustic wave elements incorporated in one package is not limited to two. A desired number of surface acoustic wave elements, three or more, may be incorporated in one package.

As described above, according to the surface acoustic wave device and a method of manufacturing it according to the present invention, an extremely compact multichip package surface acoustic wave device can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface acoustic wave device comprising a plurality of surface acoustic wave elements, each having a comb electrode formed on a piezoelectric substrate and connection terminals connected to the comb electrode; and a package which has a die attach surface to which each of the connection terminals is joined or bonded through a bonding member, and in which said plurality of surface acoustic wave elements are housed side by side.

wherein the bonding member has a shape elongated in a direction substantially perpendicular to a direction in which said surface acoustic wave elements are juxtaposed.

2. A surface acoustic wave device according to claim 1, wherein said plurality of surface acoustic wave elements include a surface acoustic wave element having a frequency characteristic different from that of other surface acoustic wave elements.

3. A surface acoustic wave device according to claim 1, wherein the connection terminal is formed into an elongated shape which is shorter along a direction in which said surface acoustic wave elements are juxtaposed.

* * * * *